(12) United States Patent
Wang et al.

(10) Patent No.: US 11,374,135 B2
(45) Date of Patent: Jun. 28, 2022

(54) SENSOR AND METHOD OF FORMING THE SAME

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 82 days.

(21) Appl. No.: 16/556,333

(22) Filed: Aug. 30, 2019

(65) Prior Publication Data

US 2021/0066514 A1    Mar. 4, 2021

(51) Int. Cl.
*H01L 31/02* (2006.01)
*H01L 31/028* (2006.01)
*H01L 31/18* (2006.01)
*H01L 31/0392* (2006.01)
(Continued)

(52) U.S. Cl.
CPC ...... *H01L 31/02027* (2013.01); *H01L 31/028* (2013.01); *H01L 31/0312* (2013.01); *H01L 31/03921* (2013.01); *H01L 31/107* (2013.01); *H01L 31/1804* (2013.01)

(58) Field of Classification Search
CPC .............................. H01L 31/036–03921; H01L 31/0248–035281; H01L 31/0224; H01L 31/022416; H01L 31/022433
See application file for complete search history.

(56) References Cited

U.S. PATENT DOCUMENTS

| | | | |
|---|---|---|---|
| 2010/0038540 A1* | 2/2010 | Hannebauer | G01J 5/04 250/338.1 |
| 2011/0095388 A1 | 4/2011 | Richter et al. | |
| 2014/0263975 A1 | 9/2014 | Nagano et al. | |

(Continued)

FOREIGN PATENT DOCUMENTS

| | | |
|---|---|---|
| CN | 103890971 A | 6/2014 |
| CN | 104977599 A | 10/2015 |

(Continued)

OTHER PUBLICATIONS

Office action of parallel Taiwanese patent application No. 109125805 dated Apr. 16, 2021, 2 pages, for information purpose only.

(Continued)

*Primary Examiner* — Julio J Maldonado
*Assistant Examiner* — Stanetta D Isaac
(74) *Attorney, Agent, or Firm* — Viering Jentschura & Partner mbB

(57) ABSTRACT

A sensor may be provided, including a substrate having a first semiconductor layer, a second semiconductor layer, and a buried insulator layer arranged between the first semiconductor layer and the second semiconductor layer. The sensor may further include a photodiode arranged in the first semiconductor layer; and a quenching resistive element electrically connected in series with the photodiode. The quenching resistive element is arranged in the second semiconductor layer, and the quenching resistive element is arranged over the photodiode but separated from the photodiode by the buried insulator layer.

12 Claims, 7 Drawing Sheets

(51) Int. Cl.
    *H01L 31/107*    (2006.01)
    *H01L 31/0312*    (2006.01)

(56) References Cited

U.S. PATENT DOCUMENTS

| | | | |
|---|---|---|---|
| 2015/0296161 | A1 | 10/2015 | Saito et al. |
| 2015/0380457 | A1 | 12/2015 | Fujii et al. |
| 2017/0314989 | A1* | 11/2017 | Mazzillo ............ G01J 1/429 |
| 2018/0202859 | A1 | 7/2018 | Mazzillo et al. |
| 2020/0249083 | A1 | 8/2020 | Ito et al. |

FOREIGN PATENT DOCUMENTS

| | | |
|---|---|---|
| CN | 105009289 A | 10/2015 |
| CN | 110036491 A | 7/2019 |
| EP | 3273478 A1 | 1/2018 |
| EP | 3493275 A1 | 6/2019 |

OTHER PUBLICATIONS

Rochas et al., "Single photon detector fabricated in a complementary metal-oxide-semiconductor high-voltage technology", Review of Scientific Instruments, Jul. 2003, pp. 3263-3270, vol. 74, No. 7.

Richardson et al., "Low Dark Count Single-Photon Avalanche Diode Structure Compatible With Standard Nanometer Scale CMOS Technology", IEEE Photonics Technology Letters, Jul. 15, 2009, pp. 1020-1022, vol. 21, No. 14, IEEE.

Zhang et al., "Demonstration of a silicon photomultiplier with bulk integrated quenching resistors on epitaxial silicon", Nuclear Instruments and Methods in Physics Research A, 2010, 6 pages, vol. 621.

Nagano et al., "Improvement of Multi-Pixel Photon Counter (MPPC)", 2011 IEEE Nuclear Science Symposium Conference Record, 2011, pp. 1657-1659, IEEE.

Lee et al., "High-Performance Back-Illuminated Three-Dimensional Stacked Single-Photon Avalanche Diode Implemented in 45-nm CMOS Technology", IEEE Journal of Selected Topics in Quantum Electronics, 2018, 9 pages, vol. 24, No. 6, IEEE.

Webster et al., "A silicon photomultiplier with >30% detection efficiency from 450-750nm and 11.6μm pitch NMOS-only pixel with 21.6% fill factor in 130nm CMOS", 2012 Proceedings of the Solid-State Device Research Conference (ESSDERC), 2012, pp. 238-241, IEEE.

Barbarino et al., "A new high-gain vacuum photomultiplier based upon the amplification of a Geiger-mode p-n function", Nuclear Instruments and Methods in Physics Research A, 2008, pp. 326-331, vol. 594.

Barbarino et al., "Silicon Photo Multipliers Detectors Operating in Geiger Regime: an Unlimited Device for Future Applications", Photodiodes—World Activities in 2011, 2011, 45 pages.

Vignetti et al., "Simulation study of a novel 3D SPAD pixel in an advanced FD-SOI technology", Solid-State Electronics, 2017, pp. 163-171, vol. 128.

Lee et al., "A first single-photon avalanche diode fabricated in standard SOI CMOS technology with a full characterization of the device", Optics Express, 2015, 10 pages, vol. 23, No. 10.

\* cited by examiner

SENSOR AND METHOD OF FORMING THE SAME

TECHNICAL FIELD

The present disclosure relates generally to a sensor and a method of forming a sensor.

BACKGROUND

Single-photon avalanche diodes (SPADs, or Geiger mode avalanche diodes), capable of detecting and time-stamping single optical photons, have reached high detection efficiency and timing resolution, and can be widely used in microscopy, biomedical diagnostics, space telescopes and consumer electronics.

SPADs are based on a p-n junction, which is reverse biased at an operating voltage Vop that exceeds a breakdown voltage $V_B$ of the junction. At this bias, a single charge carrier injected into the depletion layer can trigger a self-sustaining avalanche, giving rise to a macroscopic level current. If the primary carrier is photo-generated, the leading edge of the avalanche pulse marks the arrival time of the detected photon. The high avalanche current could cause permanent damage in the device. For this reason, the avalanche current must be quenched to avoid damaging the device by overheating. Accordingly, the SPAD usually needs suitable quenching electronics, e.g., a ballast quench resistor having a resistance over 100 kΩ, to interrupt the avalanche process right after the avalanche build-up by promptly lowering the reverse bias of the junction below the breakdown voltage. To detect another photon, the reverse bias is raised again above the breakdown voltage.

SPAD based on standard complementary metal-oxide-semiconductor (CMOS) technology is a cost-effective solution due to their compatibility with standard CMOS processes. Conventional bulk silicon CMOS SPAD is usually integrated with surface polysilicon quenching resistor, which may result in relatively low fill factor (FF: the ratio of photo-sensitive area to total imaging or pixel area) and hence low photon detection efficiency (PDE). To obtain high fill factor and photon detection efficiency, backside illumination (BSI) may be needed.

SUMMARY

According to various non-limiting embodiments, there may be provided a sensor. The sensor may include a substrate including a first semiconductor layer, a second semiconductor layer, and a buried insulator layer arranged between the first semiconductor layer and the second semiconductor layer. The sensor may further include a photodiode arranged in the first semiconductor layer; and a quenching resistive element electrically connected in series with the photodiode. The quenching resistive element is arranged in the second semiconductor layer, and the quenching resistive element is arranged over the photodiode but separated from the photodiode by the buried insulator layer.

According to various non-limiting embodiments, there may be provided a method of forming a sensor. The method may include providing a substrate, wherein the substrate includes a first semiconductor layer, a second semiconductor layer, and a buried insulator layer arranged between the first semiconductor layer and the second semiconductor layer. The method may further include forming a photodiode in the first semiconductor layer; and forming a quenching resistive element in the second semiconductor layer. The quenching resistive element is electrically connected in series with the photodiode; and the quenching resistive element is arranged over the photodiode but separated from the photodiode by the buried insulator layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
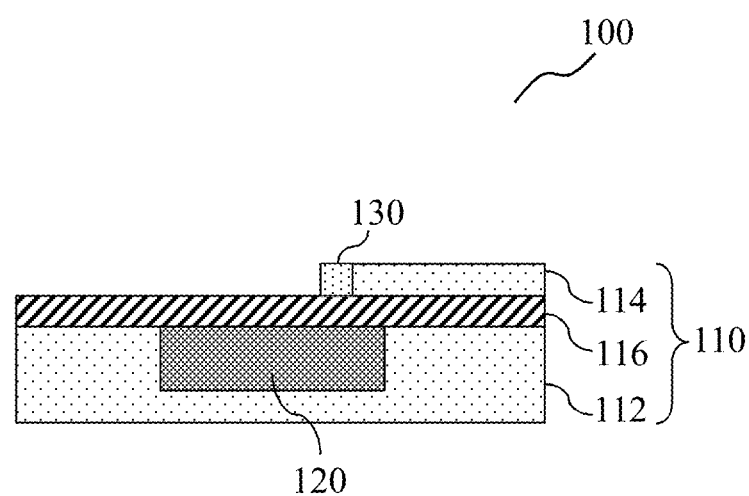
FIG. 1 shows a schematic diagram illustrating a cross-sectional view of a sensor according to various non-limiting embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "connected" (or "coupled") herein, when used to refer to two physical elements, means a direct connection between the two physical elements or a connection through one or more intermediary elements.

It should be understood that the terms "on", "over", "under", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The non-limiting embodiments described below in context of the devices are analogously valid for the respective methods, and vice versa. Furthermore, it will be understood that the embodiments described below may be combined; for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

Various non-limiting embodiments relate to a sensor, for example, a photosensor, such as a single-photon avalanche diode (SPAD) based photosensor.

FIG. 1 shows a schematic diagram illustrating a cross-sectional view of a sensor 100 according to various non-limiting embodiments.

As shown in FIG. 1, the sensor 100 may include a substrate 110. The substrate 110 may include a first semiconductor layer 112, a second semiconductor layer 114, and a buried insulator layer 116 arranged between the first semiconductor layer 112 and the second semiconductor layer 114. The sensor 100 may further include a photodiode 120 arranged in the first semiconductor layer 112; and a quenching resistive element 130 electrically connected in series with the photodiode 120. The quenching resistive element 130 is arranged in the second semiconductor layer 114, and the quenching resistive element 130 is arranged over the photodiode 120 but separated from the photodiode 120 by the buried insulator layer 116.

According to various non-limiting embodiments, an integrated sensor 100 is provided, wherein the photodiode 120 and the quenching resistive element 130 are integrated in separate semiconductor layers of the multi-layer substrate 110, with the quenching resistive element 130 overlapping the photodiode 120. In this manner, a smaller footprint can be achieved by the sensor 100 of various non-limiting embodiments. Accordingly, a higher fill factor (FF: a ratio of photo-sensitive area to total imaging or pixel area) can be achieved by the sensor 100 of various non-limiting embodiments. Hence, a higher photon detection efficiency (PDE) can also be achieved by the sensor 100, as PDE=FF×PDP (photon detection probability).

According to various non-limiting embodiments, the first semiconductor layer 112 of the substrate 110 may include a material, such as but not limited to, silicon (Si), germanium (Ge), silicon-germanium (SiGe), or combinations thereof.

According to various non-limiting embodiments, the second semiconductor layer 114 of the substrate 110 may include a material, such as but not limited to, silicon, germanium, silicon-germanium, germanium-tin (GeSn), graphene, indium gallium arsenide (InGaAs), cadmium sulfide (CdS), or combinations thereof.

In various non-limiting embodiments, the second semiconductor layer 114 of the substrate 110 may include a single-crystalline semiconductor material.

According to various non-limiting embodiments, the buried insulator layer 116 of the substrate 110 may include a material, such as but not limited to, silicon oxide, silicon nitride, aluminium oxide, yttrium oxide, or combinations thereof.

According to various non-limiting embodiments, the substrate 110 may be a semiconductor-on-insulator substrate. In various non-limiting embodiments, the semiconductor-on-insulator substrate 110 may be provided or formed such that the second semiconductor layer 114 of the substrate 110 may be a single-crystalline semiconductor layer. In a non-limiting example, the substrate 110 may be a silicon-on-insulator (SOI) substrate, wherein the second semiconductor layer 114 may include single-crystalline silicon. In various non-limiting embodiments, the substrate 110 may be a fully-depleted silicon-on-insulator (FD-SOI) substrate.

Examples of the semiconductor-on-insulator substrate 110 may include but are not limited to a silicon-on-insulator (SOI) substrate, a germanium-on-insulator (GeOI) substrate, a SiGe-on-insulator (SiGe-OI) substrate, a GeSn-on-insulator (GeSnOI) substrate, a graphene-on-insulator (graphene-OI) substrate, a InGaAs-on-insulator (InGaAs-OI) substrate, a CdS-on-insulator substrate, or combinations thereof.

According to various non-limiting embodiments, the quenching resistive element 130 may be formed from the second semiconductor layer 114, and may include the same material as the second semiconductor layer 114. In various non-limiting embodiments, the quenching resistive element 130 may be formed of a single-crystalline semiconductor material. In various non-limiting embodiments, the quenching resistive element 130 may include a single-crystalline silicon resistor. In various non-limiting embodiments, the quenching resistive element 130 may include other types of quenching electronics, such as a quenching transistor.

According to various non-limiting embodiments, at least one of a length or a doping concentration of the quenching resistive element 130 is configured to provide a desired quenching resistance. In other words, the quenching resistance may be adjustable by adjusting either one or both of the length and the doping concentration of the quenching resistive element 130. In various non-limiting embodiments, the doping concentration of the quenching resistive element 130 may be in a range from about 1e16 cm$^{-3}$ to about 1e17 cm$^{-3}$. In various non-limiting embodiments, the quenching resistive element 130 and the second semiconductor layer 114 may have the same doping concentration or different doping concentrations. The length of the quenching resistive element 130 may be in a range from about 1 nm to about 10 μm, e.g. from 2 nm to 1 μm, e.g. from 5 nm to 500 nm, e.g. from 10 nm to 100 nm, e.g. from 30 nm to 50 nm. In various non-limiting embodiments, the desired quenching resistance may be equal to or higher than 100 kΩ. In various non-limiting embodiments, the desired quenching resistance may be in a range from about 100 kΩ to about 10MΩ.

According to various non-limiting embodiments, a width of the quenching resistive element 130 may be in a range from about 1 nm to about 1000 nm, e.g., from 2 nm to 500 nm, e.g., from 5 nm to 50 nm. In a non-limiting example, the width of the quenching resistive element 130 may be in a range from about 6 nm to about 8 nm. A width/length (W/L) ratio of the quenching resistive element 130 may be in a range from about 1/100 to about 1/10. A thickness of the quenching resistive element 130 may be in a range from about 1 nm to about 10 μm, e.g. from 2 nm to 1 μm, e.g. from 5 nm to 500 nm, e.g. from 6 nm to 10 nm. In a non-limiting example, the thickness of the quenching resistive element 130 may be in a range from about 6 nm to about 8 nm.

According to various non-limiting embodiments, the size of the quenching resistive element 130, e.g., the length or the area of the quenching resistive element 130, is substantially smaller than the size of the photodiode 120, such that only a small portion (e.g., less than 50%, e.g., less than 20%, e.g., less than 10%, e.g., less than 1%, e.g., less than 0.1%) of the photodiode 120 is covered by the quenching resistive element 130 arranged thereon. In various non-limiting embodiments, a diameter or a width of the photodiode 120 may be in a range from about 10 nm to about 100 μm, e.g. from about 100 nm to about 10 μm, e.g. from about 200 nm to about 900 nm. In a non-limiting embodiment, the photodiode 120 may have a diameter of about 10 μm, much larger than the quenching resistive element 130 which may have a length of about 100 nm and a width of about 10 nm.

Although the non-limiting embodiments above describes exemplary ranges for the dimensions of the quenching resistive element 130 and the photodiode 120, it is understood that the dimensions of the quenching resistive element 130 and the photodiode 120 may be configured to be larger or smaller than the above exemplary ranges of values, depending the design choices or requirements or the technology development.

According to various non-limiting embodiments, the photodiode 120 may include a single-photon avalanche diode (SPAD), which is configured to be reverse biased for photon detection.

According to various non-limiting embodiments, the photodiode 120 has a light incident surface arranged under the buried insulator layer 116. The quenching resistive element 130 is arranged over the light incident surface of the photodiode 120 and the second semiconductor layer 114 is substantially absent over the light incident surface of the photodiode 120, such that the light incident surface of the photodiode 120 is configured to receive light through the buried insulator layer 116. According to various non-limiting embodiments, a read-out circuit for the sensor 100, which may prevent light incidence or block light illumination, is absent over the light incident surface of the photodiode 120, such that the light incident surface of the photodiode 120 is configured to receive light through the buried insulator layer 116. In various embodiments, the read-out circuit may be configured to sense an avalanche current of the photodiode 120 triggered by an incoming photon, and generate a corresponding output signal (e.g., a digital output pulse) indicating detection of the incoming photon. In various non-limiting embodiments, the read-out circuit may include a time-to-digital converter (TDC).

In the non-limiting embodiments shown in FIG. 1, the top surface of the photodiode 120 in contact with the buried insulator layer 116 may be the light incident surface, and the second semiconductor layer 114 is substantially absent over the light incident surface of the photodiode 120, e.g. only covers a sufficiently small portion of the light incident surface of the photodiode 120 along with the quenching resistive element 130. In various non-limiting embodiments, the second semiconductor layer 114, except for the quenching resistive element 130 formed therein, may be entirely absent over the light incident surface of the photodiode 120 as shown in the non-limiting embodiments of FIG. 2 below. In various non-limiting embodiments, the buried insulator layer 116 over the light incident surface of the photodiode 120 may be substantially exposed, in other words, the second semiconductor layer 114 and other electronics (e.g., read-out circuit for the sensor 100) are not present on a substantial portion of the buried insulator layer 116 over the light incident surface of the photodiode 120, enabling a front side illumination (FSI) of the sensor 100 where light is transmitted to the front surface of the photodiode 120 through the buried insulator layer 116.

According to various non-limiting embodiments, the sensor 100 may further include an anode (not shown in FIG. 1) electrically connected with a P-type region of the photodiode 120 and a cathode (not shown in FIG. 1) electrically connected with a N-type region of the photodiode 120. The anode and the cathode may be arranged over a periphery of the photodiode 120 and are spaced apart from each other via an isolation region (not shown in FIG. 1) at least partially arranged in the first semiconductor layer 112.

According to various non-limiting embodiments, the quenching resistive element 130 may be spaced apart from the anode and the cathode via a further isolation region at least partially arranged in the first semiconductor layer 112.

Figure 2:
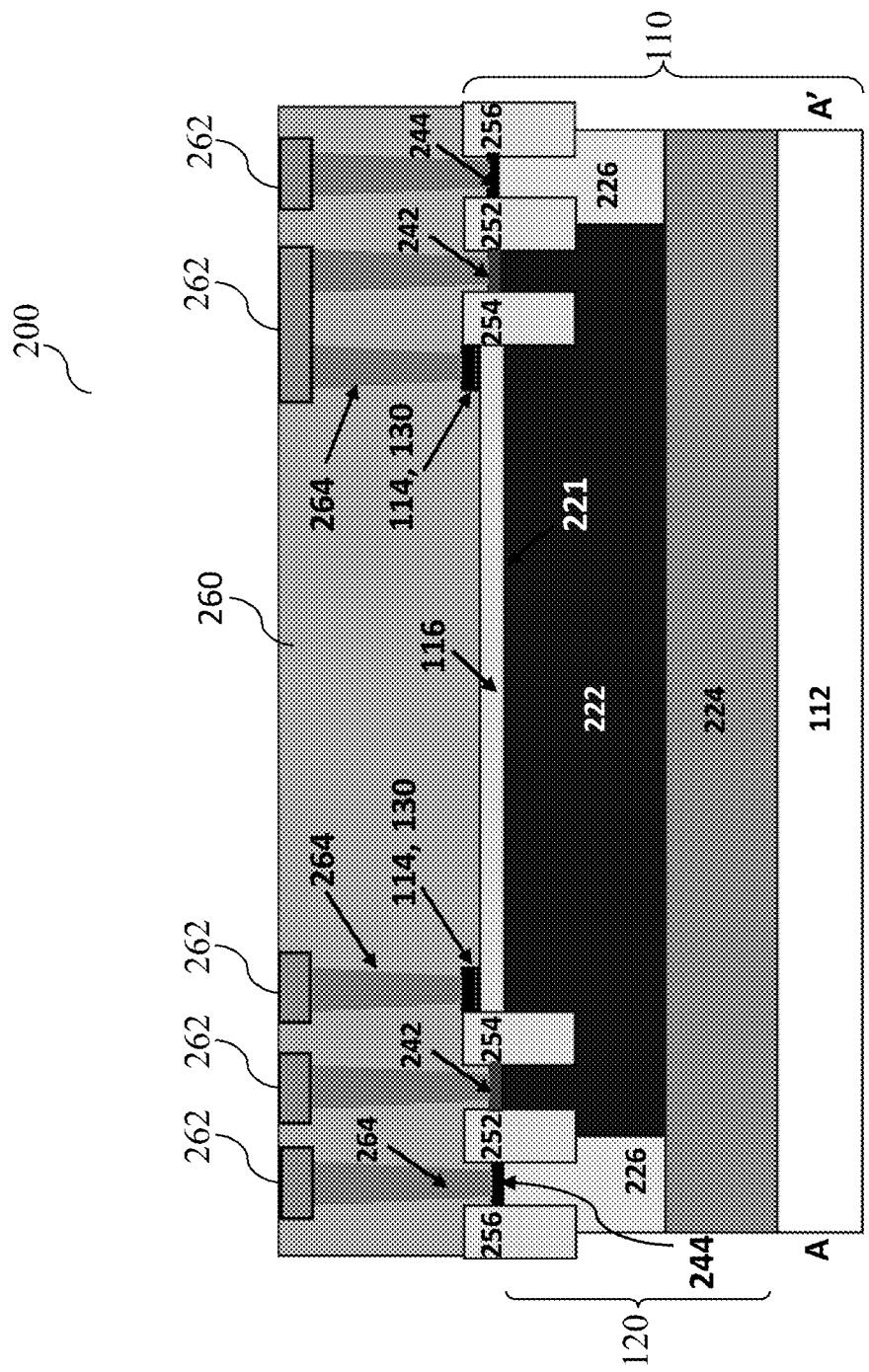
FIG. 2 shows a cross-sectional view of a sensor according to various non-limiting embodiments.
Figure 3:
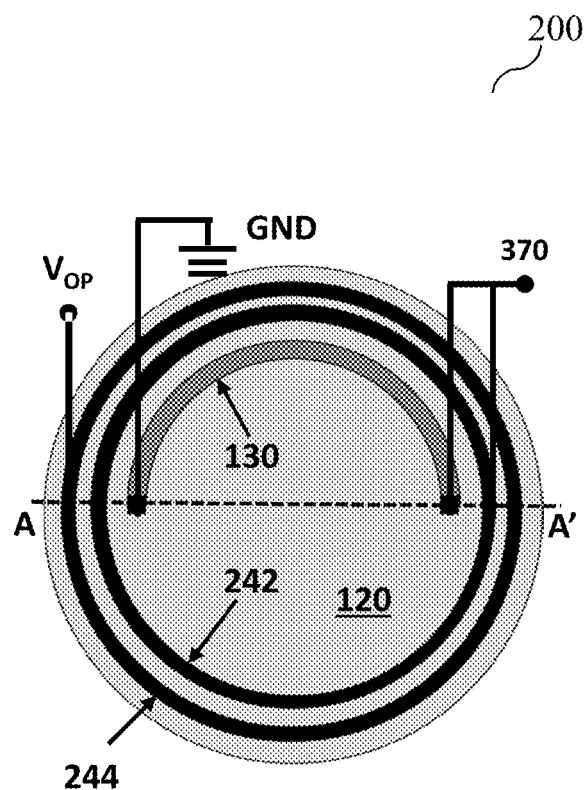
FIG. 3 shows a top view of the sensor of FIG. 2 according to various non-limiting embodiments.

FIG. 2 shows a cross-sectional view of a sensor 200 according to various non-limiting embodiments, and FIG. 3 shows a top view of the sensor 200 according to various non-limiting embodiments. The sensor 200 is similar to the sensor 100 of FIG. 1, and thus the common features are labeled with the same reference numerals. Various embodiments described with reference to FIG. 1 are analogously valid for the sensor 200 of FIG. 2 and FIG. 3, and vice versa.

Similar to the sensor 100, the sensor 200 may include the substrate 110 having the first semiconductor layer 112, the second semiconductor layer 114, and the buried insulator layer 116 arranged between the first semiconductor layer 112 and the second semiconductor layer 114. The sensor 200 may further include the photodiode 120 arranged in the first semiconductor layer 112; and the quenching resistive element 130 electrically connected in series with the photodiode 120. The quenching resistive element 130 is arranged in the second semiconductor layer 114, and the quenching resistive element 130 is arranged over the photodiode 120 but separated from the photodiode 120 by the buried insulator layer 116.

As described in various non-limiting embodiments above, the substrate 110 may be a semiconductor-on-insulator substrate, which may be provided or formed such that the second semiconductor layer 114 of the substrate 110 may be a single-crystalline semiconductor layer. Examples of the semiconductor-on-insulator substrate 110 may include but are not limited to a silicon-on-insulator (SOI) substrate, a germanium-on-insulator (GeOI) substrate, a SiGe-on-insulator (SiGe-OI) substrate, a GeSn-on-insulator (GeSnOI) substrate, a graphene-on-insulator (graphene-OI) substrate, a InGaAs-on-insulator (InGaAs-OI) substrate, a CdS-on-insulator substrate, or combinations thereof. In a non-limiting example, the substrate 110 may be a silicon-on-insulator substrate, wherein the second semiconductor layer 114 may include single-crystalline silicon. In various non-limiting embodiments, the substrate 110 may be a fully-depleted silicon-on-insulator (FD-SOI) substrate.

According to various non-limiting embodiments, the quenching resistive element 130 may be formed in or from the second semiconductor layer 114, and may include the same material as the second semiconductor layer 114. In various non-limiting embodiments, the quenching resistive element 130 may be formed of a single-crystalline semiconductor material. In various non-limiting embodiments, the quenching resistive element 130 may include a single-crystalline silicon resistor. In various non-limiting embodiments, the quenching resistive element 130 may include other types of quenching electronics, such as a quenching transistor.

According to various non-limiting embodiments, the photodiode 120 may include a single-photon avalanche diode (SPAD), which is configured to be reverse biased for photon detection.

According to various non-limiting embodiments, the photodiode 120 may include a first conductivity region 222 and a second conductivity region 224 forming a P-N junction. In various non-limiting embodiments, the first conductivity region 222 may be a P-type region, and the second conductivity region 224 may be a N-type region. In various non-limiting embodiments, the conductivity types may be reversed, so that the first conductivity region 222 and the second conductivity region 224 may be a N-type region and a P-type region, respectively.

In various non-limiting embodiments described herein, the second conductivity region 224 may be a deep N-well arranged in the first semiconductor layer 112, and the first conductivity region 222 may be a P-well arranged over the deep N-well 224. It is understood that the conductivity types of the first conductivity region 222 and the second conductivity region 224 may be reversed accordingly in other embodiments.

In various non-limiting embodiments, one or both of the P-type region 222 and the N-type region 224 may include one or more regions of different doping concentrations. By way of example, the P-type region 222 may include a P+ region arranged over a P-well region. The N-type region 224 may include a N+ region arranged under a N-well region. In various non-limiting embodiments, the first conductivity region 222 and the second conductivity region 224 may be arranged in various suitable configurations to form the single-photon avalanche diode.

According to various non-limiting embodiments, the photodiode 120 has a light incident surface 221 arranged under the buried insulator layer 116. The light incident surface 221 is the top surface or the front surface of the photodiode 120, from which side incoming light or photon is received.

According to various non-limiting embodiments, the quenching resistive element 130 is arranged over the light incident surface 221 of the photodiode 120 and the second semiconductor layer 114 is substantially absent over the light incident surface 221 of the photodiode 120, such that the light incident surface 221 of the photodiode 120 is configured to receive light through the buried insulator layer 116. According to various non-limiting embodiments, a read-out circuit for the sensor 200, which may prevent light incidence or block light illumination, are absent over the light incident surface 221 of the photodiode 120, thereby enabling the front side illumination of the sensor 200. In various non-limiting embodiments, the read-out circuit may include a time-to-digital converter.

Different from the non-limiting embodiments of FIG. 1 wherein the second semiconductor layer 114 is partially maintained over the buried insulator layer 116, the second semiconductor layer 114 in the sensor 200 of FIG. 2 is completely removed except for the quenching resistive element 130 formed therein. The quenching resistive element 130 may be formed, for example, by etching the second semiconductor layer 114 to form the quenching resistive element 130 in the desired or predetermined shape. In the non-limiting embodiments of FIG. 2, the remaining of the second semiconductor layer 114 may be removed such that only the part of the second semiconductor layer 114 forming the quenching resistive element 130 is arranged and maintained over the photodiode 120 and the buried insulator layer 116. Accordingly, the buried insulator layer 116 over the light incident surface of the photodiode 120 may be substantially exposed. In other words, the second semiconductor layer 114 and other electronics (e.g. read-out circuit for the sensor 200), which may prevent light incidence or block light illumination, are not present on a substantial portion of the buried insulator layer 116 over the light incident surface 221 of the photodiode 120, thereby enabling the front side illumination of the sensor 200.

As shown in the top view of the sensor 200 in FIG. 3, the quenching resistive element 130 is in the shape of a semicircle arranged over the top surface of the photodiode 120, which is shown as two segments 130 in the cross-sectional view of FIG. 2 along the line A-A' of FIG. 3. In various non-limiting embodiments, the quenching resistive element 130 may be in any other suitable shapes, examples of which may include but are not limited to arc, circle, fin, nanowire, nanoribbon, square, rectangle, etc. The shape and/or length of the quenching resistive element 130 may be configured or adjusted for resistance optimization.

According to various non-limiting embodiments, the size of the quenching resistive element 130, e.g., the length or the area of the quenching resistive element 130, is substantially smaller than the size of the photodiode 120, such that only a small portion (e.g., less than 50%, e.g., less than 20%, e.g., less than 10%, e.g., less than 1%, e.g., less than 0.1%) of the photodiode 120 is covered by the quenching resistive element 130 arranged thereon. In various non-limiting embodiments, the diameter or the width of the photodiode 120 may be in a range from about 10 nm to about 100 μm, e.g. from about 100 nm to about 10 μm, e.g. from about 200 nm to about 900 nm. In a non-limiting embodiment, the photodiode 120 may have a diameter of about 10 μm, much larger than the quenching resistive element 130 which may have a length of about 100 nm and a width of about 10 nm.

As shown in the non-limiting embodiments of FIG. 3, the photodiode 120 may be in a circular shape. It is understood that the photodiode 120 may be formed in other suitable shapes, such as a square or rectangle. Due to the relative small size of the quenching resistive element 130 arranged over the photodiode 120, a substantial large portion of the photodiode 120 is able to receive incident light from the front side. The quenching resistive element 130 may be located near a periphery of the photodiode 120 as shown in the non-limiting embodiments of FIG. 3, or may be arranged at any suitable location over the top surface 221 of the photodiode 120 due to its small size.

According to various non-limiting embodiments, at least one of the length or the doping concentration of the quenching resistive element 130 is configured to provide a desired quenching resistance (e.g. in a range from about 100 kΩ to about 10MΩ). In various non-limiting embodiments, the doping concentration of the quenching resistive element 130 may be in a range from about 1e16 cm$^{-3}$ to about 1e17 cm$^{-3}$. The length of the quenching resistive element 130 may be in a range from about 1 nm to about 10 μm, e.g. from 2 nm to e.g. from 5 nm to 500 nm, e.g. from 10 nm to 100 nm, e.g. from 30 nm to 50 nm.

According to various non-limiting embodiments, the sensor 200 may further include an anode 242 electrically connected with the P-type region 222 of the photodiode 120 and a cathode 244 electrically connected with the N-type region 224 of the photodiode 120. It is understood that the locations of the anode 242 and the cathode 244 may be exchanged in the non-limiting embodiments wherein the region 222 is the N-type region and the region 24 is the P-type region as described above.

In various non-limiting embodiments, the anode 242 may be arranged on the P-type region 222 of the photodiode 120, e.g. in direct contact with the P-type region 222. The cathode 244 may be arranged over the N-type region 224 of the photodiode 120. The cathode 244 may be electrically connected with the N-type region 224 of the photodiode 120 via a third conductivity region 226 arranged in the first semiconductor layer 112. The third conductivity region 226 may be a N-well in the non-limiting embodiments wherein the region 224 is a N-type region, or may be a P-well in the non-limiting embodiments wherein the region 224 is a P-type region. The third conductivity region 226 may be arranged between the cathode 244 and the N-type region 224.

According to various non-limiting embodiments, the anode 242 and the cathode 244 may be arranged over a periphery of the photodiode 120 as shown in FIG. 2 and FIG. 3. The anode 242 and the cathode 244 arranged over the periphery of the photodiode 120 may be understood that the anode 242 and the cathode 244 are arranged above the photodiode 120 and near the periphery of the photodiode 120. From the top view, one or both of the anode 242 and the cathode 244 may be arranged within but approximate the periphery of the photodiode 120 as shown in the non-limiting embodiments of FIG. 3, or may be arranged to at least partially overlap the periphery of the photodiode 120 in other non-limiting embodiments. The anode 242 and the cathode 244 may be spaced apart from each other via an isolation region 252 at least partially arranged in the first semiconductor layer 112. The isolation region 252 may be arranged laterally between the anode 242 and the cathode 244. In various non-limiting embodiments, the isolation region 252 may be a shallow trench isolation (STI). In various non-limiting embodiments, the anode 242 and the cathode 244 may be in a shape of a circular ring (e.g., as shown in FIG. 3) or a rectangular ring over the periphery of the photodiode 120, substantially corresponding to the shape of the photodiode 120.

According to various non-limiting embodiments, the quenching resistive element 130 may be spaced apart from the anode and the cathode via a further isolation region 254 at least partially arranged in the first semiconductor layer 112. The further isolation region 254 may be a shallow trench isolation (STI). The further isolation region 254 may be arranged laterally between the resistive element 130 and the anode 242, the cathode 244.

According to various non-limiting embodiments, additional isolation region 256 may be arranged at least partially around the periphery of the photodiode 120 and at least partially in the first semiconductor layer 112, so as to isolate the photodiode 120 from adjacent components, such as a further sensor having a similar structure as the sensor 200 and arranged in the same substrate 110.

In various non-limiting embodiments, the electrical connection among various components may be provided by a plurality of contacts 262 and vias 264 arranged in a dielectric layer 260, e.g., an inter-layer dielectric (ILD) layer 260. The dielectric layer 260 may be arranged over the buried insulator layer 116, and covers the respective components including the quenching resistive element 130, the anode 242, the cathode 244, the isolation regions 252, 254, 256, etc.

In various non-limiting embodiments as shown in FIG. 2 and FIG. 3, the quenching resistive element 130 may have one terminal electrically connected with the ground (GND) via one or more of the vias 264 and the contacts 262. The quenching resistive element 130 may have the other terminal electrically connected with the anode 242 via one or more of the vias 264 and the contacts 262, thereby connected in series with the photodiode 120 through the anode 242. In various non-limiting embodiments as shown in FIG. 3, the quenching resistive element 130 and the anode 242 are connected to an output node 370, which may be further connected to a read-out circuit (not shown in FIG. 2 and FIG. 3), such as a time-to-digital converter (TDC). For simplicity, the read-out circuit and complete BEOL (back end of line) metal lines are not shown in FIG. 3.

Figure 4:
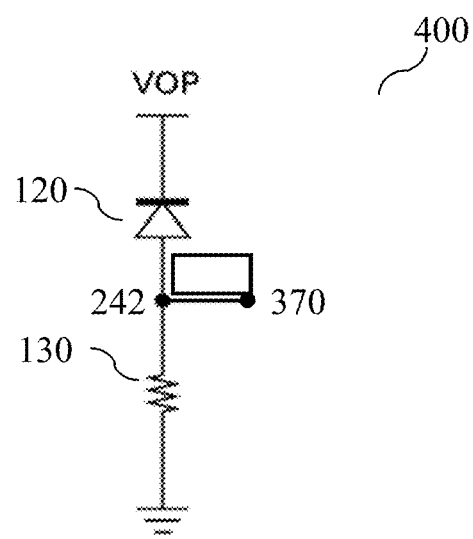
FIG. 4 shows an equivalent circuit of the sensor of FIG. 2 and FIG. 3 according to various non-limiting embodiments.

FIG. 4 shows an equivalent circuit 400 of the sensor 200 according to various non-limiting embodiments. As shown in FIG. 4, one terminal of the quenching resistive element 130 is grounded, and the other terminal of the quenching resistive element 130 is electrically connected in series with the photodiode 120 through the anode 242, wherein the anode 242 is connected to the output node 370 for electrical connection to the TDC. An operation voltage Vop, which exceeds a breakdown voltage $V_B$ by an excess voltage $V_E$, may be applied to the cathode 244 to reversely bias the photodiode 120. At the reverse bias voltage Vop, a photon-generated carrier can trigger a large avalanche current. The leading edge of the avalanche current may be sensed by the TDC, and a digital output pulse synchronous with the avalanche build-up may be generated by the TDC indicating detection of the incoming photon. The quenching resistive element 120 then stops the self-sustaining avalanche current to avoid damages to the photodiode 130 and to detect a subsequent photon.

Figure 5:
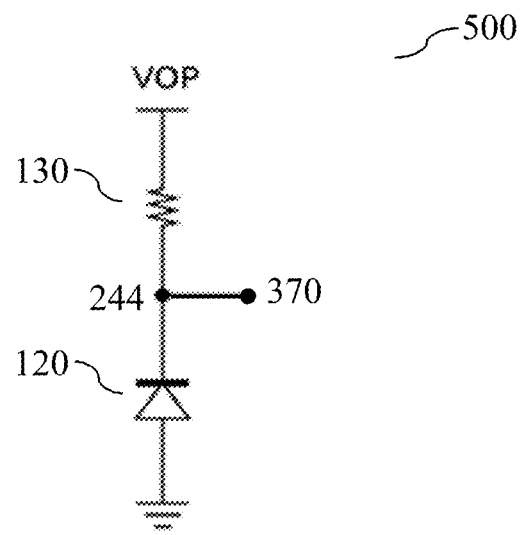
FIG. 5 shows an equivalent circuit of a sensor according to various non-limiting embodiments.

Although FIG. 4 shows a circuit configuration of the sensor 200, it is understood that the sensor 200 may be configured in other suitable circuit configurations according to various non-limiting embodiments. FIG. 5 shows a circuit configuration 500 of the sensor 200 according to various non-limiting embodiments.

As shown in FIG. 5, the quenching resistive element 130 is electrically connected in series with the photodiode 120 similar to the circuit configuration of FIG. 4. Different from the embodiments of FIG. 4, the photodiode 120 is grounded through the anode in the circuit configuration 500 of FIG. 5. One terminal of the quenching resistive element 130 is configured to be biased at the operation voltage Vop. The other terminal of the quenching resistive element 130 is electrically connected in series with the photodiode 120 through the cathode 244, wherein the cathode 244 is connected to the output node 370 for electrical connection to the TDC.

Figure 6:
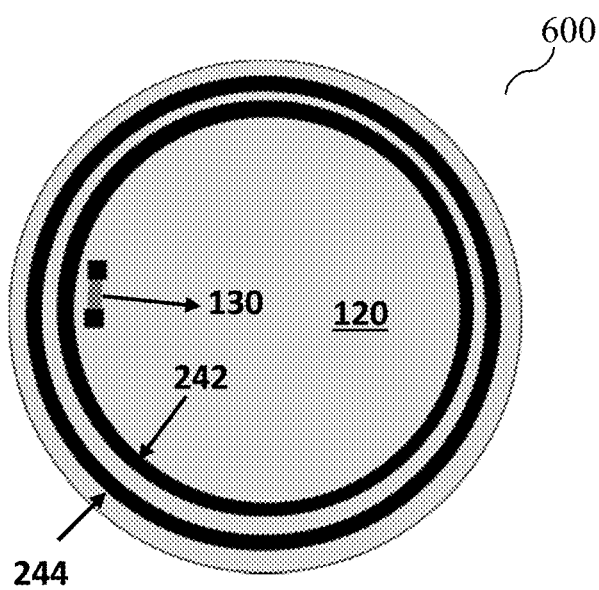
FIG. 6 shows a top view of a sensor according to various embodiments.

As shown in the embodiments of FIG. 2 and FIG. 3, the quenching resistive element 130 is in a semi-circular shape. FIG. 6 shows a top view of a sensor 600 according to various embodiments, wherein the quenching resistive element 130 may be in the shape of a short arc. The sensor 600 is similar to the sensor 100, 200 of FIGS. 1-3, and thus the common features are labeled with the same reference numerals. Various embodiments described with reference to FIGS. 1-5 are analogously valid for the sensor 600 of FIG. 6, and vice versa.

As shown in FIG. 6, the sensor 600 is similar to the sensor 200, and includes the quenching resistive element 130 arranged over the photodiode 120. The anode 242 and the cathode 244 may be arranged over the periphery of the photodiode 120, and may be electrically connected with the P-type region and the N-type region of the photodiode 120, respectively. As shown in the non-limiting embodiments of FIG. 6, the quenching resistive element 130 may be a short arc, having a length much smaller than the length of the semi-circular quenching resistive element 130 of FIG. 3. Accordingly, in the sensor 600, less area of the light incident surface of the photodiode 120 is shielded by the quenching resistive element 130 and more space is provided for light illumination, as compared to the semi-circular quenching resistive element 130 shown in FIG. 3.

In various non-limiting embodiments, the shape of the quenching resistive element 130 may be configured or selected depending on one or both of the length and the doping concentration of the quenching resistive element 130, which in turn may be configured or selected depending on the desired quenching resistance.

Figure 7:
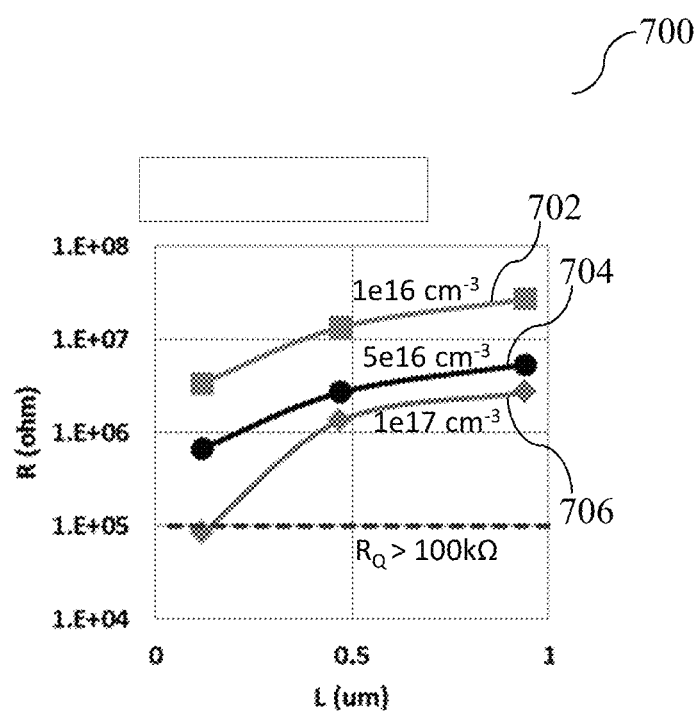
FIG. 7 shows a graph illustrating a relationship of resistance (R) versus length (L) for a quenching resistive element at different doping concentrations, according to various non-limiting embodiments.

FIG. 7 shows a graph 700 illustrating a relationship of resistance (R) versus length (L) for the quenching resistive element at different doping concentrations, according to various non-limiting embodiments.

In the non-limiting embodiments of FIG. 7, the respective values of the quenching resistive element may be measured using the quenching resistive element 130 described in various non-limiting embodiments above. The quenching resistive element 130 may be formed on the second semiconductor layer 114 of the substrate 110, where the substrate 110 may be a 22 nm FD-SOI substrate. The second semiconductor layer 114 of the substrate 110, in which the quenching resistive element 130 is arranged or formed, may be a doped silicon layer with a thickness of about 6-8 nm, e.g. 7 nm. The photodiode 120 may have a diameter of about 0.3 μm, and the critical dimension (CD) of the quenching resistive element 130 may be about 50 nm.

As shown in FIG. 7, the horizontal axis represents the length (L) of the quenching resistive element 130, and the vertical axis represents the resistance (R) of the quenching resistive element 130. Curves 702, 704, 706 represent the resistance (R) as a function of the length (L) of the quenching resistive element 130 at the doping concentrations of 1e16 $cm^{-3}$, 5e16 $cm^{-3}$, and 1e17 $cm^{-3}$, respectively. At a given length, the resistance of the quenching resistive element 130 is increased when the doping concentration is decreased from 1e17 $cm^{-3}$ to 1e16 $cm^{-3}$. At the given doping concentration, the resistance of the quenching resistive element 130 is increased when the length of the quenching resistive element 130 is increased. According to the graph of FIG. 7, the quenching resistive element 130 configured in a longer length and a lower doping concentration may provide a larger resistance.

As shown in FIG. 7, the quenching resistive element 130 provided in various non-limiting embodiments is able to provide a desired quenching resistance $R_Q$>100 kΩ for all doping concentrations, when the length of the quenching resistive element 130 is larger than about 0.03 μm.

According to the results shown in FIG. 7, the quenching resistor 130 provided in the sensor 100, 200, 600 of various non-limiting embodiments above can achieve adjustable quenching resistance and meet the requirement of quenching resistance (e.g., about 100 kΩ to 10MΩ) in a short length. The quenching resistor 130 formed in the top single crystalline semiconductor layer 114 of the substrate 110 may be formed in various shapes (e.g., arc, circle, square, rectangle, fin, nanowire, nanoribbon, etc.) for resistance optimization.

In an illustrative non-limiting embodiment, the quenching resistive element 130 may be in an arc shape as shown in the sensor 600 of FIG. 6, wherein the quenching resistive element 130 may be 1/32 of a circle formed in the FD-SOI substrate with the top Si layer of about 7 nm in thickness and about 1e16 $cm^{-3}$ in doping concentration. The quenching resistive element 130 with a length of about 0.03 μm is able to provide a resistance of about 840 kΩ as shown in Case 1 of Table 1 below. Therefore, the sensor 600 according to various non-limiting embodiments is able to achieve low fill factor and front side illumination.

Table 1 further shows parameters of conventional polysilicon (Poly-Si) quenching resistors in different shapes. In Case 2, the conventional polysilicon quenching resistor is in the shape of a circle, and provides a resistance of 38 kΩ at the length of 0.94 μm and the thickness of 100 nm. It can be observed that the conventional polysilicon quenching resistor has a much larger dimension than the quenching resistor 130 of various non-limiting embodiments, but provide a much smaller resistance which is lower than the required quenching resistance of at least 100 kΩ. To meet the quenching resistance requirement, the dimension of the conventional polysilicon quenching resistor needs to be greatly increased, and thereby would consume more space outside the photodiode and lead to a low fill factor of the sensor.

In Case 3, the conventional polysilicon quenching resistor is in the shape of a coil, and provides a resistance of 105 kΩ at the length of 2.1 μm and the thickness of 100 nm. It can be observed that the conventional polysilicon quenching resistor of Case 3 has a much larger dimension than the quenching resistor 130 of various non-limiting embodiments, but could only provide a resistance much lower than the quenching resistance 840 kΩ provided by the smaller quenching resistor 130 of various non-limiting embodiments. The conventional coil-shaped polysilicon quenching resistor of Case 3 has a large dimension that would cover the entire light incident surface of the photodiode and block light illumination, and therefore front side illumination is not possible.

TABLE 1

| Comparison of various quenching resistors | | | | |
|---|---|---|---|---|
| Case | Condition | Thickness [nm] | Length [μm] | R [kΩ] | >100 kΩ |
| 1 | FD-SOI: 1/32 of circle | 7 | 0.03 | 840 | Yes |
| 2 | Poly-Si quenching resistor: 1 circle | 100 | 0.94 | 38 | No |
| 3 | Poly-Si quenching resistor: coiled | 100 | 2.1 | 105 | Yes |

Figure 8A:
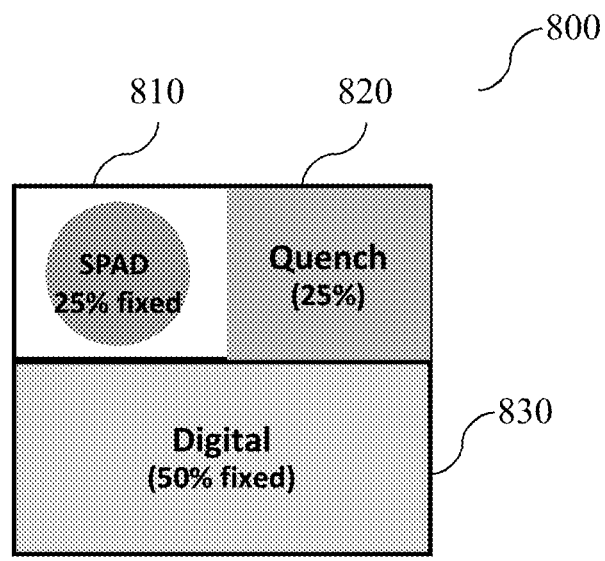
FIG. 8A shows a prior art sensor chip.

FIG. 8A shows a prior art sensor chip 800 including a SPAD 810, a quenching resistor (QR) 820 and digital electronics 830 arranged laterally. The footprint of the sensor chip 800 is 100%, including the SPAD 810 of 25%, the QR of 25%, and the digital electronics of 50% (Footprint=SPAD+QR+Digital=100%). The fill factor excluding the digital electronics is 50%, according to the equation "FF (excluding Digital)=SPAD/(SPAD+QR)=50%". The fill factor of the sensor chip 800 is 25%, according to the equation "FF=SPAD/footprint=25%".

Figure 8B:
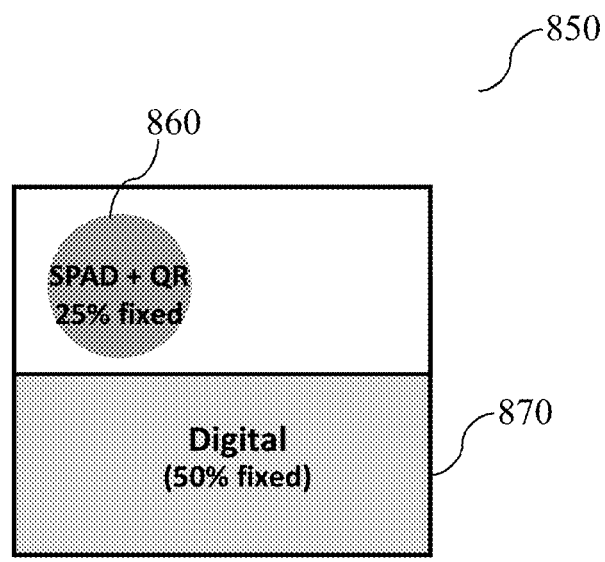
FIG. 8B shows a sensor according to various non-limiting embodiments.

FIG. 8B shows a sensor 850 according to various non-limiting embodiments. The sensor 850 may be the sensors 100, 200, 600 described in various non-limiting embodiments above. The sensor 850 includes the SPAD and the QR which are integrated in separate semiconductor layers of the multi-layer substrate. The QR is arranged over the SPAD and overlaps the SPAD. Accordingly, the integrated SPAD+QR 860 occupies 25% space of the sensor 850, saving the 25% space consumed by the QR 820 of the prior art sensor 800. The sensor 850 may further include digital electronics 870 (e.g., the TDC), which consume 50% space. Accordingly, the footprint of the sensor 850 is 75% (Footprint=SPAD+QR+Digital=75%). The fill factor excluding the digital electronics is 100%, according to the equation "FF (excluding Digital)=SPAD/(SPAD+QR)=100%". The fill factor of the sensor 850 is 33%, according to the equation "FF=SPAD/footprint=25%/75%=33%".

Compared with the prior art sensor chip 800, the sensor 850 of various non-limiting embodiments achieves 50% higher FF (excluding digital electronics) and saves 25% footprint, based on 0.13 um CMOS.

Various non-limiting embodiments above provide an integrated sensor 100, 200, 600, 850, wherein the photodiode 120 and the quenching resistive element 130 are integrated in separate semiconductor layers of the multi-layer substrate 110, with the quenching resistive element 130 overlapping the photodiode 120. In this manner, a smaller footprint can be achieved by the sensor 100, 200, 600, 850 of various non-limiting embodiments. Further, by providing the quenching resistive element 130 in the second semiconductor layer 114 of the multi-layer substrate 110, the quenching resistive element 130 in a small size or area could achieve a desired high quenching resistance, and accordingly only a small portion of the photodiode 120 is overlapped or covered by the quenching resistive element 130. Hence, a higher fill factor and a higher photon detection efficiency can be achieved by the sensor 100, 200, 600, 850 of various non-limiting embodiments.

According to various non-limiting embodiments, a sensor array may be provided in which a plurality of sensors 100, 200, 600 may be arranged in an array or a matrix form. The plurality of sensors 100, 200, 600 may be electrically connected in parallel, and may share the common digital electronics 870 shown in FIG. 8B.

In the following, a method of forming the sensor 100, 200, 600, 850 according to various non-limiting embodiments will be described.

Figure 9:
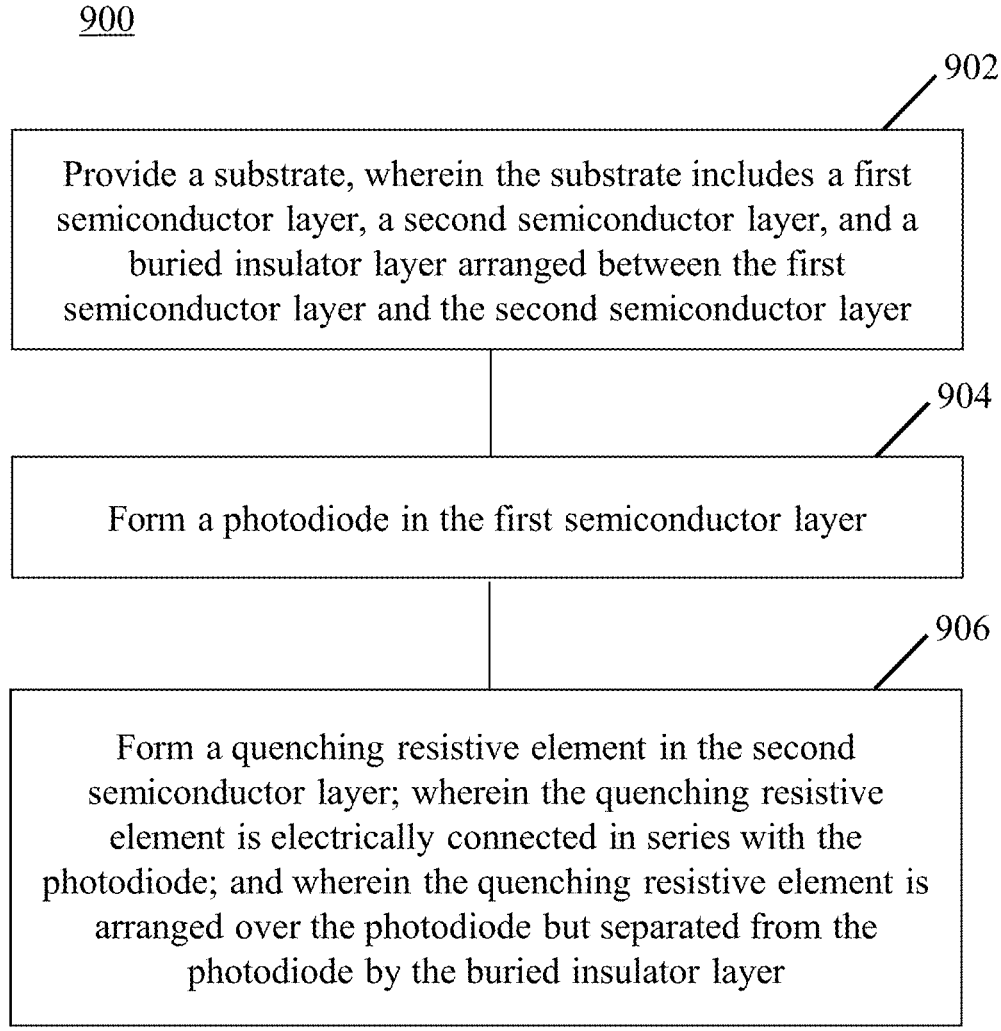
FIG. 9 shows a flowchart illustrating a method of forming a sensor according to various non-limiting embodiments.

FIG. 9 shows a flowchart 900 illustrating a method of forming a sensor according to various non-limiting embodiments. The method may be used to form the sensor 100, 200, 600, 850 described in various non-limiting embodiments above. Various non-limiting embodiments described in context of the sensor are analogously valid for the respective method, and vice versa.

At 902, a substrate may be provided. The substrate may include a first semiconductor layer, a second semiconductor layer, and a buried insulator layer arranged between the first semiconductor layer and the second semiconductor layer.

At 904, a photodiode may be formed in the first semiconductor layer.

At 906, a quenching resistive element may be formed in the second semiconductor layer. The quenching resistive element is electrically connected in series with the photodiode; and the quenching resistive element is arranged over the photodiode but separated from the photodiode by the buried insulator layer.

As described in various non-limiting embodiments above, the substrate may be provided as a semiconductor-on-insulator substrate, which may be prepared or formed such that the second semiconductor layer of the substrate may be a single-crystalline semiconductor layer. For example, the semiconductor-on-insulator substrate may be prepared or formed using SIMOX (separation by implantation of oxygen) method, wafer bonding, or seed methods. Examples of the semiconductor-on-insulator substrate may include but are not limited to a silicon-on-insulator (SOI) substrate, a germanium-on-insulator (GeOI) substrate, a SiGe-on-insulator (SiGe-OI) substrate, a GeSn-on-insulator (GeSnOI) substrate, a graphene-on-insulator (graphene-OI) substrate, a InGaAs-on-insulator (InGaAs-OI) substrate, a CdS-on-insulator substrate, or combinations thereof. According to various non-limiting embodiments, the second semiconductor layer may include a single-crystalline semiconductor material. In a non-limiting example, the substrate may be a silicon-on-insulator substrate, wherein the second semiconductor layer may include single-crystalline silicon. In various non-limiting embodiments, the substrate may be a fully-depleted silicon-on-insulator (FD-SOI) substrate.

According to various non-limiting embodiments, the quenching resistive element may be formed from the second semiconductor layer, and may include the same material as the second semiconductor layer. In various non-limiting embodiments, the second semiconductor layer may be etched to form the quenching resistive element arranged over the photodiode.

In various non-limiting embodiments, the quenching resistive element may be formed of a single-crystalline semiconductor material. In various non-limiting embodiments, forming the quenching resistive element may include forming a single-crystalline silicon resistor. In various non-limiting embodiments, the quenching resistive element may be formed as other types of quenching electronics, such as a quenching transistor.

According to various non-limiting embodiments, forming the quenching resistive element may include configuring at least one of a length or a doping concentration of the quenching resistive element to provide a desired quenching resistance. In other words, the quenching resistance may be adjustable by adjusting either one or both of the length and the doping concentration of the quenching resistive element. In various non-limiting embodiments, the doping concentration of the quenching resistive element may be in a range from about 1e16 cm$^{-3}$ to about 1e17 cm$^{-3}$. In various non-limiting embodiments, the quenching resistive element and the second semiconductor layer may have the same doping concentration or different doping concentrations. The length of the quenching resistive element may be in a range from about 1 nm to about 10 µm, e.g. from 2 nm to e.g. from 5 nm to 500 nm, e.g. from 10 nm to 100 nm, e.g. from 30 nm to 50 nm. In various non-limiting embodiments, the desired quenching resistance may be equal to or higher than 100 kΩ. In various non-limiting embodiments, the desired quenching resistance may be in a range from about 100 kΩ to about 10MΩ.

According to various non-limiting embodiments, a width of the quenching resistive element may be formed in a range from about 1 nm to about 1000 nm, e.g., from 2 nm to 500 nm, e.g., from 5 nm to 50 nm. In a non-limiting example, the width of the quenching resistive element 130 may be in a range from about 6 nm to about 8 nm. A width/length (W/L) ratio of the quenching resistive element may be in a range from about 1/100 to about 1/10. A thickness of the quenching resistive element may be formed in a range from about 1 nm to about 10 μm, e.g. from 2 nm to 1 μm, e.g. from 5 nm to 500 nm, e.g. from 6 nm to 10 nm. In a non-limiting example, the thickness of the quenching resistive element 130 may be in a range from about 6 nm to about 8 nm.

According to various non-limiting embodiments, the size of the quenching resistive element, e.g., the length or the area of the quenching resistive element, is formed to be substantially smaller than the size of the photodiode, such that only a small portion (e.g., less than 50%, e.g., less than 20%, e.g., less than 10%, e.g., less than 1%, e.g., less than 0.1%) of the photodiode is covered by the quenching resistive element arranged thereon. In various non-limiting embodiments, a diameter or a width of the photodiode may be in a range from about 10 nm to about 100 μm, e.g. from about 100 nm to about 10 μm, e.g. from about 200 nm to about 900 nm. In a non-limiting embodiment, the photodiode 120 may have a diameter of about 10 μm, much larger than the quenching resistive element 130 which may have a length of about 100 nm and a width of about 10 nm.

Although the non-limiting embodiments above describes exemplary ranges for the dimensions of the quenching resistive element and the photodiode, it is understood that the dimensions of the quenching resistive element and the photodiode may be formed to be larger or smaller than the above exemplary ranges of values, depending the design choices or requirements or the technology development.

According to various non-limiting embodiments, forming the photodiode may include forming a single-photon avalanche diode, which is configured to be reverse biased for photon detection.

According to various non-limiting embodiments, the photodiode has a light incident surface arranged under the buried insulator layer. Forming the quenching resistive element may include etching the second semiconductor layer to form the quenching resistive element over the light incident surface of the photodiode and to substantially remove the second semiconductor layer over the light incident surface of the photodiode, and a read-out circuit for the sensor may be absent over the light incident surface of the photodiode, such that the light incident surface of the photodiode is configured to receive light through the buried insulator layer. In various non-limiting embodiments, the second semiconductor layer may be etched to cover only a sufficiently small portion of the light incident surface of the photodiode along with the quenching resistive element as shown in FIG. 1. In various non-limiting embodiments, the second semiconductor layer, except for the quenching resistive element formed therein, may be entirely etched away as shown in the non-limiting embodiments of FIG. 2 above. In various non-limiting embodiments, the buried insulator layer over the light incident surface of the photodiode may be substantially exposed, in other words, the second semiconductor layer and other electronics (e.g., read-out circuit) are not present on a substantial portion of the buried insulator layer over the light incident surface of the photodiode, enabling the front side illumination of the sensor where light is transmitted to the front surface of the photodiode through the buried insulator layer.

According to various non-limiting embodiments, the method may further include forming an anode to electrically connect with a P-type region of the photodiode, and forming a cathode to electrically connect with a N-type region of the photodiode. The anode and the cathode may be arranged over a periphery of the photodiode and are spaced apart from each other via an isolation region at least partially arranged in the first semiconductor layer. The isolation region may be formed as a shallow trench isolation, and may be arranged laterally between the anode and the cathode.

According to various non-limiting embodiments, the method may further include forming a further isolation region at least partially arranged in the first semiconductor layer to space the quenching resistive element apart from the anode and the cathode. The further isolation region may be formed as a shallow trench isolation, and may be arranged laterally between the quenching resistive element and the anode, the cathode.

According to various non-limiting embodiments described above, the sensor 100, 200, 600, 850 with a higher fill factor and a higher photon detection efficiency are provided. The method of forming the sensor 100, 200, 600, 850 according to various non-limiting embodiments is CMOS compatible, and therefore provide a cost-effective fabrication solution. The sensor 100, 200, 600, 850 according to various non-limiting embodiments can be widely used in microscopy, biomedical diagnostics, space telescopes and consumer electronics Examples of applications of the sensor may include embedded quantum security, optolab-on-chip, 3D vision, near infrared imaging (NIRI), time-of-flight positron emission tomography (TOF PET), fluorescence lifetime imaging microscopy (FLIM), super-resolution GSDIM (ground state depletion microscopy followed by individual molecule return), time-resolved Raman spectroscopy, single-photon emission computed tomography (SPECT), fluorescence correlation spectroscopy (FCS), etc.

The following examples pertain to further embodiments.

Example 1 may be a sensor including: a substrate having a first semiconductor layer, a second semiconductor layer, and a buried insulator layer arranged between the first semiconductor layer and the second semiconductor layer; a photodiode arranged in the first semiconductor layer; and a quenching resistive element electrically connected in series with the photodiode. The quenching resistive element is arranged in the second semiconductor layer, and the quenching resistive element is arranged over the photodiode but separated from the photodiode by the buried insulator layer.

In Example 2, the subject matter of Example 1 may optionally include that the first semiconductor layer may include a material, such as but not limited to, silicon, germanium, silicon-germanium, or combinations thereof.

In Example 3, the subject matter of Example 1 or Example 2 may optionally include that the second semiconductor layer may include a material, such as but not limited to, silicon, germanium, silicon-germanium, germanium-tin, graphene, indium gallium arsenide, cadmium sulfide, or combinations thereof.

In Example 4, the subject matter of any one of Examples 1 to 3 may optionally include that the second semiconductor layer and the quenching resistive element may include a single-crystalline semiconductor material.

In Example 5, the subject matter of any one of Examples 1 to 4 may optionally include that the buried insulator layer may include a material, such as but not limited to, silicon oxide, silicon nitride, aluminium oxide, yttrium oxide, or combinations thereof.

In Example 6, the subject matter of any one of Examples 1 to 5 may optionally include that the quenching resistive element may include a single-crystalline silicon resistor.

In Example 7, the subject matter of any one of Examples 1 to 6 may optionally include that at least one of a length or a doping concentration of the quenching resistive element may be configured to provide a desired quenching resistance.

In Example 8, the subject matter of Example 7 may optionally include that the length of the quenching resistive element may be configured in a range from about 1 nm to about 10 μm; the doping concentration of the quenching resistive element may be configured in a range from about 1e16 cm$^{-3}$ to about 1e17 cm$^{-3}$.

In Example 9, the subject matter of any one of Examples 1 to 8 may optionally include that the photodiode may include a single-photon avalanche diode.

In Example 10, the subject matter of any one of Examples 1 to 9 may optionally include that the photodiode has a light incident surface arranged under the buried insulator layer, wherein the quenching resistive element is arranged over the light incident surface of the photodiode, and wherein the second semiconductor layer and a read-out circuit for the sensor are substantially absent over the light incident surface of the photodiode, such that the light incident surface of the photodiode is configured to receive light through the buried insulator layer.

In Example 11, the subject matter of any one of Examples 1 to 10 may optionally include that the sensor may further include an anode electrically connected with a P-type region of the photodiode and a cathode electrically connected with a N-type region of the photodiode. The anode and the cathode are arranged over a periphery of the photodiode and are spaced apart from each other via an isolation region at least partially arranged in the first semiconductor layer.

In Example 12, the subject matter of Example 11 may optionally include that the quenching resistive element is spaced apart from the anode and the cathode via a further isolation region at least partially arranged in the first semiconductor layer.

Example 13 may be a method of forming a sensor. The method includes: providing a substrate, wherein the substrate comprises a first semiconductor layer, a second semiconductor layer, and a buried insulator layer arranged between the first semiconductor layer and the second semiconductor layer; forming a photodiode in the first semiconductor layer; and forming a quenching resistive element in the second semiconductor layer. The quenching resistive element is electrically connected in series with the photodiode; and the quenching resistive element is arranged over the photodiode and but separated from the photodiode by the buried insulator layer.

In Example 14, the subject matter of Example 13 may optionally include that the second semiconductor layer and the quenching resistive element may include a single-crystalline semiconductor material.

In Example 15, the subject matter of Example 13 or Example 14 may optionally include that forming the quenching resistive element may include forming a single-crystalline silicon resistor.

In Example 16, the subject matter of any one of Examples 13 to 15 may optionally include that forming the quenching resistive element may include etching the second semiconductor layer to form the quenching resistive element arranged over the photodiode.

In Example 17, the subject matter of any one of Examples 13 to 16 may optionally include that forming the quenching resistive element may include configuring at least one of a length or a doping concentration of the quenching resistive element to provide a desired quenching resistance.

In Example 18, the subject matter of any one of Examples 13 to 17 may optionally include that the photodiode has a light incident surface arranged under the buried insulator layer. Forming the quenching resistive element may further include etching the second semiconductor layer to form the quenching resistive element over the light incident surface of the photodiode and to substantially remove the second semiconductor layer over the light incident surface of the photodiode, and a read-out circuit for the sensor may be absent over the light incident surface of the photodiode, such that the light incident surface of the photodiode is configured to receive light through the buried insulator layer.

In Example 19, the subject matter of any one of Examples 13 to 18 may optionally include that the method may further include forming an anode to electrically connect with a P-type region of the photodiode; and forming a cathode to electrically connect with a N-type region of the photodiode. The anode and the cathode are arranged over a periphery of the photodiode and are spaced apart from each other via an isolation region at least partially arranged in the first semiconductor layer.

In Example 20, the subject matter of Example 19 may optionally include that the method may further include forming a further isolation region at least partially arranged in the first semiconductor layer to space the quenching resistive element apart from the anode and the cathode.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A sensor comprising:
    a substrate comprising a first semiconductor layer, a second semiconductor layer, and a buried insulator layer arranged between the first semiconductor layer and the second semiconductor layer;
    a photodiode arranged in the first semiconductor layer; and
    a quenching resistive element electrically connected in series with the photodiode; wherein the quenching resistive element is arranged in the second semiconductor layer, and wherein the quenching resistive element is arranged over the photodiode but entirely separated from the photodiode by the buried insulator layer.

2. The sensor of claim 1, wherein the first semiconductor layer comprises silicon, germanium, silicon-germanium, or combinations thereof;
    wherein the second semiconductor layer comprises silicon, germanium, silicon-germanium, germanium-tin, graphene, indium gallium arsenide, cadmium sulfide, or combinations thereof.

3. The sensor of claim 1, wherein the second semiconductor layer and the quenching resistive element comprise a single-crystalline semiconductor material.

4. The sensor of claim 1, wherein the buried insulator layer comprises silicon oxide, silicon nitride, aluminium oxide, yttrium oxide, or combinations thereof.

5. The sensor of claim 1, wherein the quenching resistive element comprises a single-crystalline silicon resistor.

6. The sensor of claim 1, wherein at least one of a length or a doping concentration of the quenching resistive element is configured to provide a desired quenching resistance.

7. The sensor of claim 6, wherein the length of the quenching resistive element is configured in a range from about 1nm to about 10 μm;
wherein the doping concentration of the quenching resistive element is configured in a range from about 1e16 $cm^{-3}$ to about 1e17 $cm^{-3}$.

8. The sensor of claim 1, wherein the photodiode comprises a single-photon avalanche diode.

9. The sensor of claim 1, wherein the photodiode has a light incident surface arranged under the buried insulator layer, wherein the quenching resistive element is arranged over the light incident surface of the photodiode, and wherein the second semiconductor layer and a read-out circuit for the sensor are substantially absent over the light incident surface of the photodiode, such that the light incident surface of the photodiode is configured to receive light through the buried insulator layer.

10. The sensor of claim 1, further comprising:
an anode electrically connected with a P-type region of the photodiode and a cathode electrically connected with a N-type region of the photodiode; wherein the anode and the cathode are arranged over a periphery of the photodiode and are spaced apart laterally from each other via an isolation region at least partially arranged in the first semiconductor layer.

11. The sensor of claim 10, wherein the quenching resistive element is spaced apart from the anode and the cathode via a further isolation region at least partially arranged in the first semiconductor layer.

12. The sensor of claim 1, wherein the substrate is a semiconductor-on-insulator substrate.

* * * * *